United States Patent
Motonami

[11] Patent Number: 5,185,284
[45] Date of Patent: Feb. 9, 1993

[54] METHOD OF MAKING A SEMICONDUCTOR MEMORY DEVICE

[75] Inventor: Kaoru Motonami, Hyogo, Japan

[73] Assignee: Mitsubishi Denki Kabushiki Kaisha, Tokyo, Japan

[21] Appl. No.: 758,146

[22] Filed: Sep. 12, 1991

Related U.S. Application Data

[60] Division of Ser. No. 680,010, Apr. 2, 1991, Pat. No. 5,089,868, which is a continuation of Ser. No. 410,200, Sep. 21, 1989, abandoned.

[30] Foreign Application Priority Data

May 22, 1989 [JP] Japan ............................... 64-129252

[51] Int. Cl.⁵ ............................................. H01L 21/70
[52] U.S. Cl. ........................................ 437/52; 437/47; 437/48; 437/60; 437/919
[58] Field of Search .................... 437/47, 48, 52, 60, 437/228, 233, 235, 193, 919; 357/23.6; 365/149

[56] References Cited

U.S. PATENT DOCUMENTS 4,645,564 2/1987 Morie et al. ........................ 437/919

FOREIGN PATENT DOCUMENTS

| | | |
|---|---|---|
| 0176254 | 4/1986 | European Pat. Off. . |
| 0223616 | 5/1987 | European Pat. Off. . |
| 0376685 | 7/1990 | European Pat. Off. . |
| 119053 | 5/1989 | Japan . |
| 2231718 | 11/1990 | United Kingdom . |

OTHER PUBLICATIONS

Watanabe, "Stacked Capacitor Cells for High Density Dynamic RAMS" IEDM 1988 pp. 600–603.

*Primary Examiner*—Tom Thomas
*Attorney, Agent, or Firm*—Lowe, Price, LeBlanc & Becker

[57] ABSTRACT

A semiconductor memory device which is provided with a groove type capacitor and which has been improved for increasing its storage capacity without lowering the degree of integration, and the method for producing the memory device. The device includes a first capacitor including a storage node (16) formed on the inner wall of the groove (15), a capacitor insulating film (20) and a cell plate electrode (22), a second capacitor including an electrically conductive member (43) provided on the permitter of the groove (15), the capacitor insulating film (20) and the cell plate electrode (22). The semiconductor member device has its storage capacity increased by an amount corresponding to the capacity of the second capacitor. The degree of integration is not lowered in any way since the electrically conductive member (43) forming the second capacitor is provided on the groove (15) perimeter. The method for producing the semiconductor member device is improved such that high accuracy mask matching is not required during groove (15) formation so that the production efficiency is significantly improved.

10 Claims, 12 Drawing Sheets

METHOD OF MAKING A SEMICONDUCTOR MEMORY DEVICE

This application is a division of application Ser. No. 07/680,010, filed Apr. 2, 1991, now U.S. Pat. No. 5,089,868, which is a continuation of application Ser. No. 07/410,200, filed Sep. 21, 1989, now abandoned.

BACKGROUND OF THE INVENTION

1. Field of the Invention

This invention relates in general to a semiconductor memory device and, more particularly, to a semiconductor memory device which is improved for increasing the storage capacity. It also relates to a method for producing the semiconductor memory device.

2. Description of the Prior Art

An IC memory is made up of a memory cell array composed of a large number of storage elements and input/output peripheral circuits. In many cases, these elements and peripheral circuits are formed on one and the same substrate.

Figure 5:
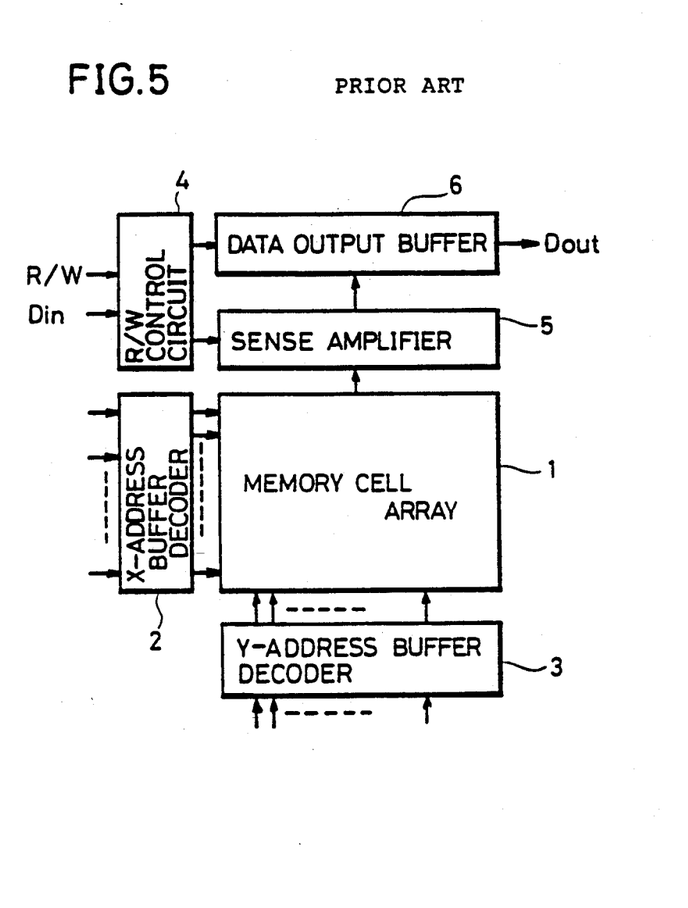
FIG. 5 is a block diagram showing an example of a conventional RAM.

FIG. 5 is a block diagram showing an example of a conventional RAM. Referring to this figure, a plurality of word lines and a plurality of bit lines are arranged in a memory cell 1 for intersecting each other. A memory cell is provided at each point of intersection between these word and bit lines. Selection of a memory cell is attained on the basis of a point of intersection between a word line selected by an X address buffer decoder 2 and and a bit line selected by a Y address buffer decoder 3. Data and written into or read out from the selected memory cell. Data write/read commands are issued by read/write (R/W) control signals supplied from a read/write control circuit 4. During data writing input data (Din) are entered in the selected memory cell via R/W control circuit 4. During data reading, data stored in the selected memory cell are sensed by a sense amplifier 5, amplified and outputted via a data output buffer 6 as to the output data (Dout).

Figure 6:
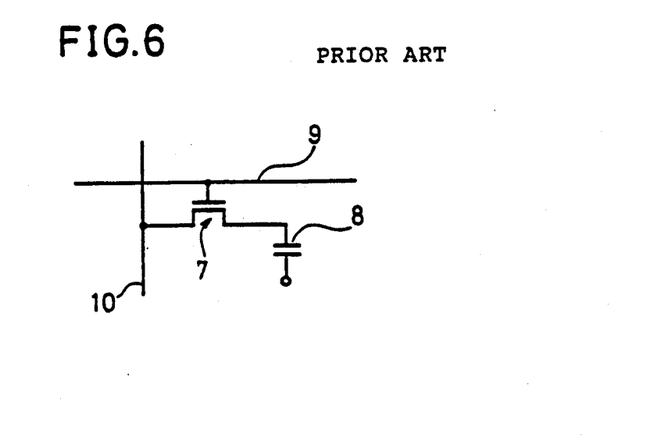
FIG. 6 shows an equivalent circuit of a dynamic memory cell, shown for illustrating the write/read out operation of a memory cell.

FIG. 6 is an equivalent circuit diagram of a dynamic memory cell for illustrating the write/read operation for a memory cell.

Referring to this figure, the dynamic memory cell includes a set of a field effect transistor 7 and a capacitor 8. The field effect transistor 7 has its gate electrode connected to a word line 9. The field effect transistor 7 connected to the capacitor 8 has its source/drain electrode connected to a bit line 10. During data writing, a predetermined potential is applied to the word line 9, so that the field effect transistor 7 is turned on and charges applied to the bit line 10 are stored in the capacitor 8. On the other hand, during data reading, a predetermined potential is applied to the word line 9. The field effect transistor 7 is thereby turned on an the charges stored in the capacitor 8 are taken out via bit line 10.

Figure 7:
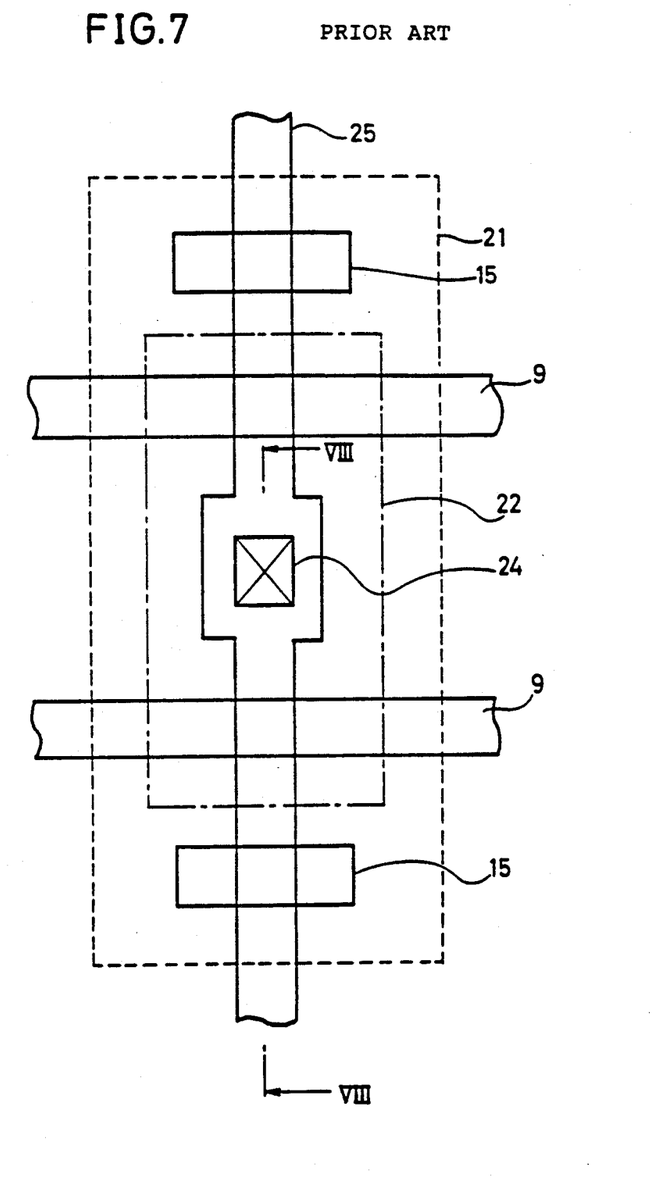
FIG. 7 is a plan view of a conventional semiconductor memory device provided with the groove type capacitor.
Figure 8:
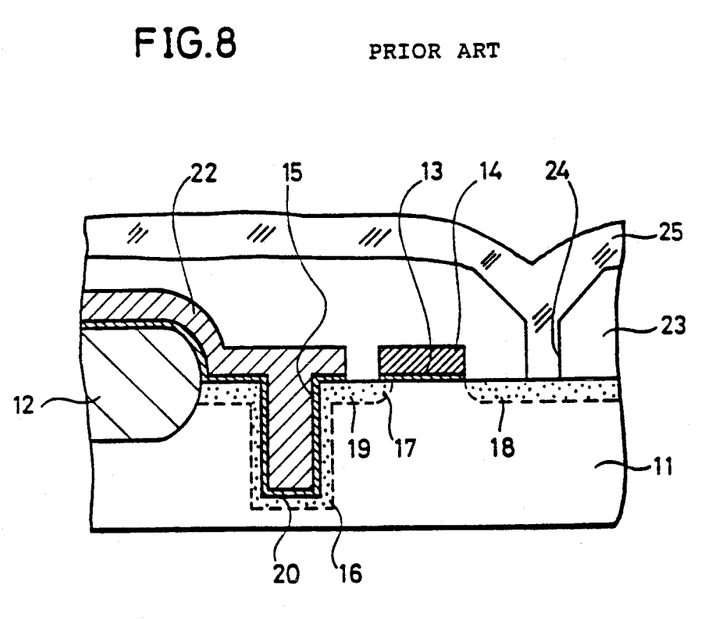
FIG. 8 is a cross-sectional view taken along line VIII—VIII in FIG. 7.

FIG. 7 is a plan view showing a conventional semiconductor memory device provided with a groove type capacitor memory cell, and FIG. 8 is a cross-sectional view taken along line VIII to VIII in FIG. 7.

Referring to these figures, an insulating film for element-to-element isolation 12 is formed on the main surface of a semiconductor substrate 11 for isolating active regions 21. A gate electrode 14, corresponding to the word line 9, is formed on the main surface of the semiconductor substrate 11 with a gate film 13 in-between. The gate electrode 14 is formed by a polycrystal silicon. Source/drain regions 17, and 18 are formed on both sides of the gate electrode 14 on the main surface of the semiconductor substrate 11. A groove 15 is formed on the main surface of the semiconductor substrate 11. A storage node is formed on the inner wall surface of the groove 15. The storage node 16 is an electrically conductive region formed by introducing the impurity ions and dispersing them into the inner wall surface of the groove 15. The storage node 16 and the source/drain region 17 are electrically connected to each other via a connecting impurity-diffusion layer 19 formed on the main surface of the semiconductor substrate 11.

A capacitor insulating film 20 is provided to cover the inner wall surface of the groove 15. This one end of the capacitor insulating film 20 is extended to overlie the insulating film for element-to-element isolation 12. A cell plate 22 is provided to cover the capacitor insulating film 20. The cell plate 22 is partially buried in the groove 15.

An interlayer insulating film 23 is provided on the overall surface of the semiconductor substrate 11 inclusive of the gate electrode 14 and the cell plate 22. A contact hole 24 is formed in the interlayer insulating film 23. A bit line 25 is connected to the source/drain region 18 by way of this control contact hole 24.

In the above described semiconductor memory device, the word line 9 is selected and a predetermined potential is applied to the gate electrode 14 to render the current path between the source/drain regions 17 and 18 conductive to perform the read/write operation.

The method for producing the above described conventional semiconductor memory device provided with the groove type capacitor is hereinafter explained.

Figure 9A:
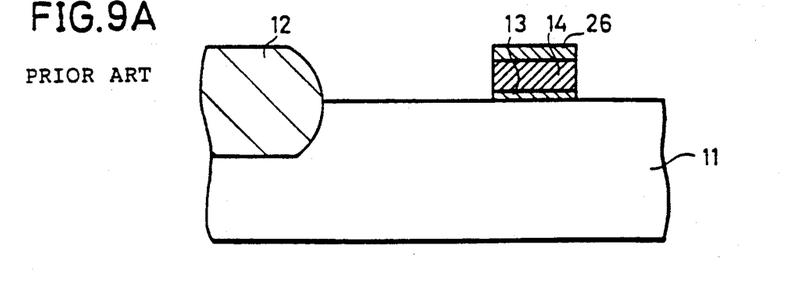
FIGS. 9A to 9G are cross-sectional views showing the production process of the semiconductor memory device shown in FIG. 8.

Referring to the FIG. 9A, the insulating film for element-to-element separation 12 is formed on the main surface of the semiconductor substrate 11 for isolating on separating an active region from another active region on the main surface of the semiconductor substrate 11. The gate oxide film 13, the gate electrode 14 and an oxide film 26 of the filed effect transistor are then formed on the substrate 11. These films may be produced by sequentially forming a thermal oxide film, polycrystal silicon layer and a CVD SiO$_2$ film on the substrate 11 and dry etching these thin films by a photolithographic method.

Figure 9B:
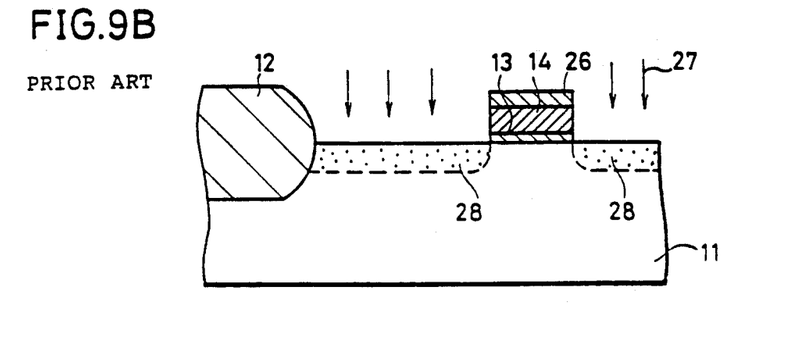

Then, referring to FIG. 9B, N-type impurity ions 27 are introduced in a self-aligning manner towards the main surface of the substrate 11. A first impurity-diffusion region 28 is then formed on both sides of the gate electrode 14 on the main surface of the semiconductor substrate 11.

Figure 9C:
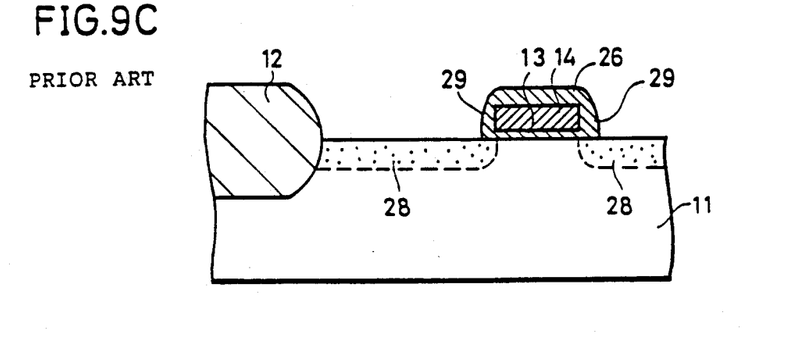

Then, referring to FIG. 9C, a sidewall spacer 29 is formed on the sidewall of the gate electrode 14.

Figure 9D:
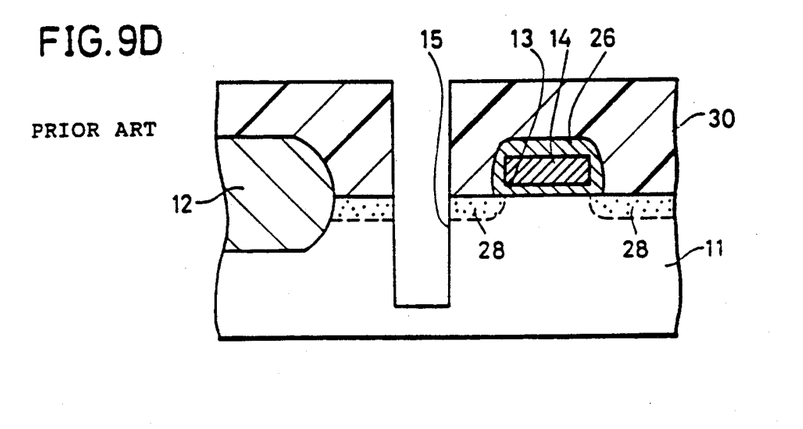

Then referring to FIG. 9D, a photoresist for etching 30 is formed on the overall surface of the semiconductor substrate 11. The photoresist 30 is then patterned by a photolithographic method for forming a hole of a desired shape above the region where the groove is to be formed. Then, using the patterned photoresist 30 as the mask, the main surface of the semiconductor substrate 11 is subjected to selective etching for forming the groove 15 on the main surface of the semiconductor substrate 11. This selective etching is performed by reactive ion etching under the conditions selected to provide the desired etching selectivity. The photoresist 30 is then removed.

Figure 9E:
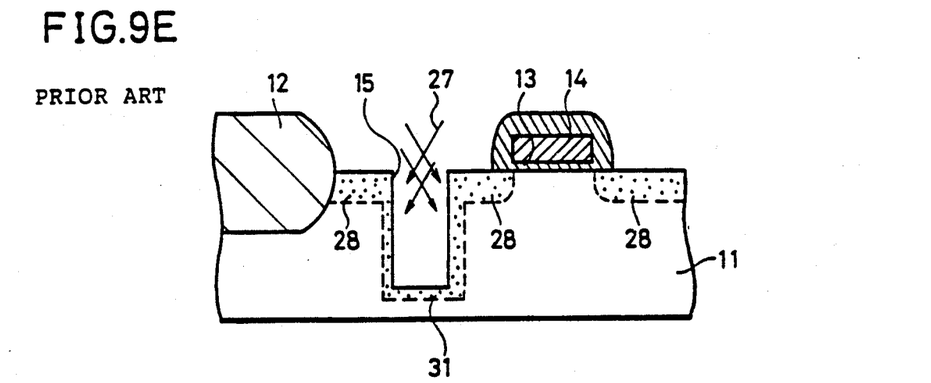

Then, referring to FIG. 9E, N-type impurity ions 27 are introduced into the inner wall surface, inclusive of the lateral and bottom sides, of the groove 15, by rotary ion implantation. After ion implantation, heat treatment is performed for forming a second impurity-diffusion region 31 contiguous to the first impurity diffusion region 28 on the inner wall surface of the groove 15.

Figure 9F:
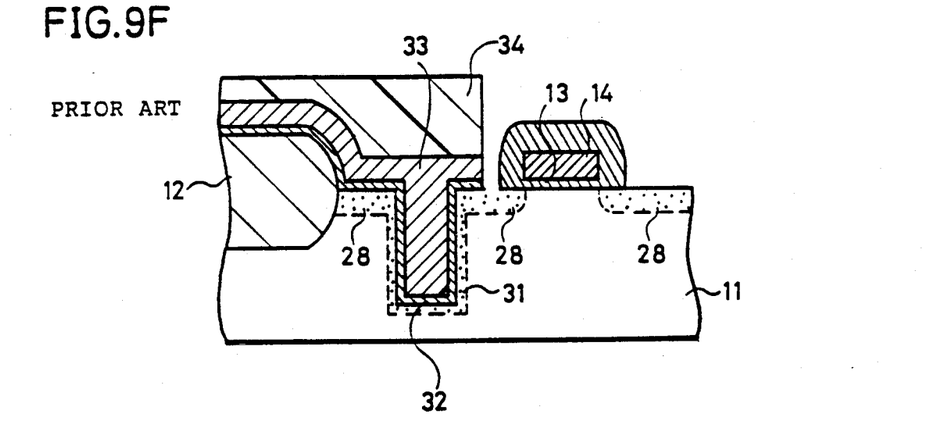

Then, referring to FIG. 9F, a nitride film 32 is formed on the overall surface of the semiconductor substrate 11, inclusive of the inner wall surface of the groove 15. After thermal oxidation of the nitride film 32, a polycrystal silicon film 33 is formed on the overall surface of the semiconductor substrate 11, inclusive of the inner surface of the groove 15, and a photoresist for etching 34 is then formed on the polycrystal silicon film 33. The photoresist 34 is then patterned to a desired shape. Then, using this patterned photoresist 34 as the mask, the nitride film 32 and the polycrystal silicon film 33 are patterned by selective etching. In this manner, a capacitor insulating film and a cell plate electrode are formed.

Figure 9G:
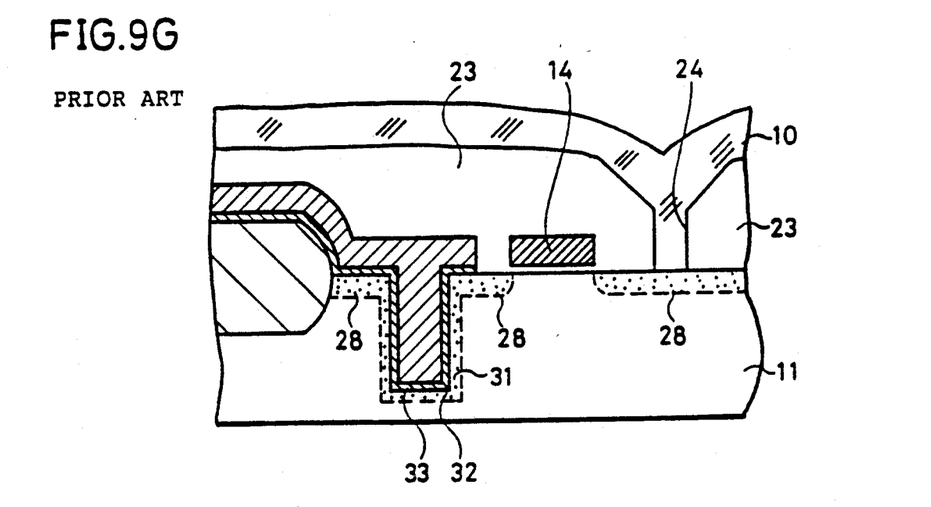

Then, referring to FIG. 9G the interlayer insulating film 23 is heaped or stacked by chemical vapor deposition (CVD) on the overall surface of the semiconductor substrate 11. The contact hole 24 is then formed in the interlayer insulating film 23 and the bit line 10 is connected by way of this contact hole to the first impurity-diffusion region 28 to produce the semiconductor memory device shown in FIG. 8.

Meanwhile, the storage capacity of the above described semiconductor memory device including the groove type capacitor may be increased by increasing the depth of the groove 15 (see FIG. 8).

As an alternative method for increasing the storage capacity of the semiconductor memory device, there is proposed in the art a semiconductor memory device including both the groove type capacitor and the stacked capacitor.

Figure 10:
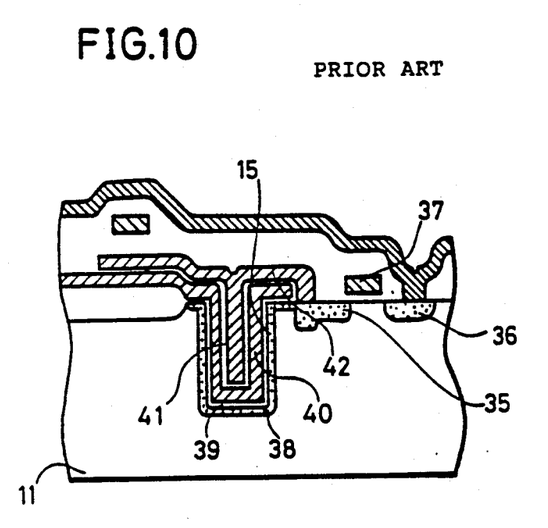
FIG. 10 is a cross-sectional view of a conventional semiconductor memory device provided with both the groove-type capacitor and the stacked capacitor.

FIG. 10 is a cross-sectional view of a semiconductor memory device including the groove type capacitor and the stacked capacitor, as disclosed in the Japanese Patent Laying-Open No. 190868/1987.

Referring to this figure, a groove 15 is formed on the main surface of the semiconductor substrate 11. A source region 35 and a drain region 36 of a MOS transistor formed around the groove 15 and in the vicinity of the semiconductor substrate surface. A gate electrode 37 is is formed astride the source region 35 and the drain region 36. An impurity-diffusion layer 38 is formed on the inner wall surface of the groove 15 and is connected to the source region 35. A first electrically conductive layer 40 is formed via an insulating film 39 to cover the inner surface of the groove 15. A second electrically conductive layer 42 is formed on the first electrically conductive layer 40 via an insulating layer 41.

In the present semiconductor memory device, the groove type capacitor is formed by the source region 35, impurity-diffusion layer 38, first electrically conductive layer 40, functioning as the cell plate, and the insulating film 39. On this groove type capacitor is formed the stacked capacitor made up of the second electrically conductive layer 42, insulating film 41 and the first electrically conductive layer 40. The groove type capacitor and the stacked capacitor are connected in series with each other to increase the memory cell capacity. The semiconductor memory device including both the groove type capacitor and the stacked capacitor is also disclosed in the Japanese Patent Laying-Open Nos. 248248/1987, 65559/1985, 37962/1987 and 7153/1987.

In the above semiconductor memory device including the groove type capacitor shown in FIG. 8, the depth of the groove 15 need be increased for increasing the capacity of the capacitor. However, increasing the depth of the groove 15 may raise a problem in mass producibility.

On the other hand, in the semiconductor memory device including both the groove type capacitor and the stacked capacitor, shown in FIG. 10, the stacked capacitor need be formed on the previously formed groove type capacitor, so that the high degree of accuracy in registration or position matching between the two types of capacitors is necessitated to raise a problem from the viewpoint of the manufacture process.

SUMMARY OF THE INVENTION

It is therefore an object of the present invention to provide a semiconductor memory device which is provided with a groove type capacitor and which has been improved to increase the storage capacity.

It is another object of the present invention to provide a semiconductor memory device which is provided with a groove type memory device and which has been improved to facilitate mass production and to increase the storage capacity.

It is a further object of the present invention to provide a semiconductor memory device which is provided with a groove type capacitor and which has been improved to increase the storage capacity without lowering the degree of integration.

It is a further object of the present invention to provide a method for producing a semiconductor memory device which is provided with a groove type capacitor and which has its storage capacity increased without lowering the degree of integration.

It is yet another object of the present invention to provide a new and improved method for a semiconductor memory device provided with a groove type capacitor, wherein the mask matching step for format ion of the groove may be simplified.

The semiconductor memory device according to the present invention stores the information depending on the presence or absence of the charges stored in the groove type capacitor. The semiconductor memory device includes a semiconductor substrate including a planar or main surface. A transistor is formed on the semiconductor substrate, and a groove is formed on the main surface. A first electrically conductive region is formed on the inner wall surface of the groove, and a second electrically conductive region is formed on the main surface of the semiconductor substrate for electrically connecting the first electrically conductive region and the transistor. An electrically conductive member is provided on the second electrically conductive region so as to contact with this second electrically conductive region. A capacitor insulating film is continuously formed to cover the exposed surface of the electrically conductive member and the inner wall surface of the groove. A cell plate electrode is provided to cover the capacitor insulating film.

In the method for producing the semiconductor memory device according to another aspect of the present invention, the gate electrode of the transistor is formed on the main surface of the semiconductor substrate. A first impurity-diffusion layer is then formed on either side of the gate electrode on the main surface of the semiconductor substrate. After formation of the first impurity-diffusion layer, the electrically conductive member is heaped on the main surface of the semiconductor substrate. The electrically conductive member is then patterned for forming an opening or hole of a desired shape at least in the upper portion of the region in which the groove type capacitor is to be formed. Then, for forming a groove for the groove type capacitor, a portion of the main surface of the semiconductor substrate exposed by forming the opening is selectively etched off. A sound impurity-diffusion layer is then formed on at least the sidewall surface of the groove. A capacitor insulating film is then formed on the main surface of the semiconductor substrate to cover the exposed surface of the electrically conductive member and the inner surface of the groove, and a cell plate electrode is then formed on the capacitor insulating film.

The semiconductor memory device according to the present invention includes a first capacitor including an electrically conductive region formed on the inner wall of a groove, capacitor insulating film and the cell plate electrode, and a second capacitor including an electrically conductive member provided at the periphery the groove, capacitor insulating film and the cell plate electrode. Therefore, the storage capacity of the semiconductor memory device is increased by an amount corresponding to the storage capacity of the second capacitor. In the other hand, the degree of integration is not lowered because the electrically conductive member is provided at the periphery of the groove. The groover may be decreased in depth when it is desired to produce the semiconductor memory device of the same storage capacity as that of the conventional conductor memory device.

In the method for producing the semiconductor memory device according to the present invention, the electrically conductive member formed on the semiconductor substrate is patterned to the desired shape and, using the patterned electrically conductive member as a mask, a portion of the main surface of the semiconductor substrate is selectively etched off in a self-aligning manner to form the groove on the main surface of the semiconductor substrate. Therefore, high accuracy mask matching is not required in forming the groove on the main surface of the semiconductor substrate and, as a result, the mass-producibility of the semiconductor memory device may be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

By referring to the drawing, an illustrative embodiment of the present invention will be explained in more detail.

Figure 1:
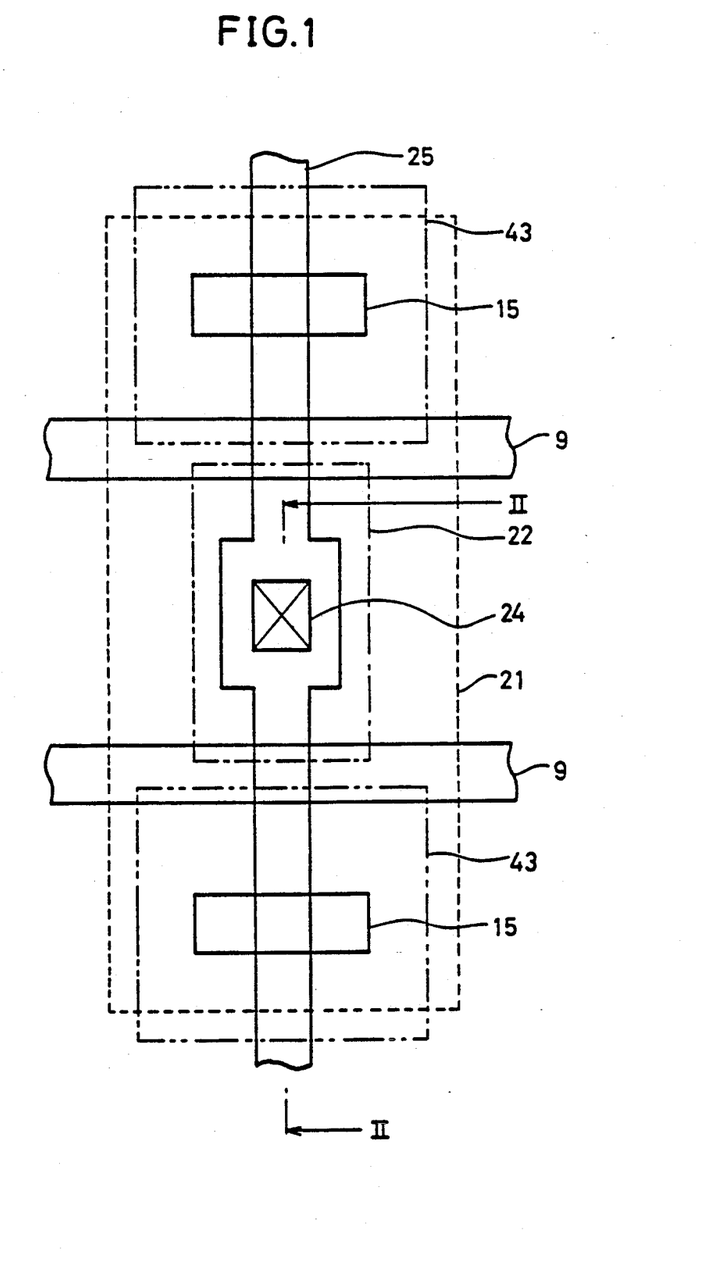
FIG. 1 is a plan view of a semiconductor memory device according to an embodiment of the present invention.
Figure 2:
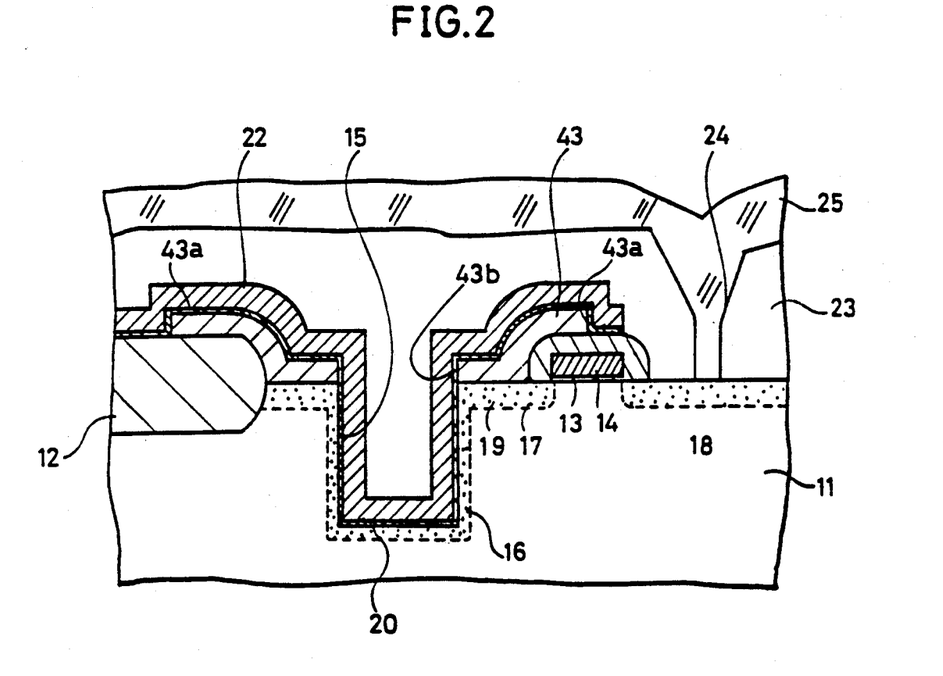
FIG. 2 is a cross-sectional view taken along line II—II of FIG. 1.

FIG. 1 is a plan view of a semiconductor memory device including the groove type capacitor memory cell according to an embodiment of the present invention, and FIG. 2 is a cross-sectional view taken along line II—II of FIG. 1.

Referring to these figures, an insulating film for element-to-element isolation 12 is provided on the main or planar surface of a semiconductor substrate 11 for separating active regions 21. A gate electrode 14, corresponding to a word line 9, is formed on the main surface of the semiconductor substrate 11 with a gate oxide film 13 in-between. The gate electrode 14 is formed of, for example, polycrystal silicon. Source/drain regions 17, 18 are formed on either sides of the gate electrode 14 on the main surface of the semiconductor substrate 11. A groove 15 is formed on the main surface of the semiconductor substrate 11. A storage node 15 is formed on the inner wall surface of the groove 15. The storage node 16 and the source/drain region 17 are connected electrically to each other by way of a connecting impurity-diffusion layer 19 provided on the main surface of the semiconductor substrate 11. An electrically conductive member 43 is provided around the groove 15 for surrounding the groove 15. The electrically conductive member 43 is provided in contact with the source/drain region 17 and the connecting impurity-diffusion layer 19. The electrically conductive member 43 has its outer space edge 43a extending to a position overlying the gate electrode 14 and the gate oxide film 13. An inner end face of the electrically conductive member 43 is at the same level as the inner wall surface of the groove 15. This electrically conductive member 43 is formed of, for example, polysilicon. A capacitor insulating film 20 is continuously formed to cover the exposed surface of the electrically conductive member 43 and the inner wall surface of the groove 15. A cell plate electrode 22 is provided to cover the capacitor insulating film 20. An interlayer insulating film 23 is formed on the overall surface of the semiconductor substrate 11. A contact hole 24 is formed in the interlayer insulating film 23. A bit line 25 is connected via this contact hole 24 to the source/drain region 18.

In the present described semiconductor memory device, a groove type first capacitor is formed by the storage node 16 formed on the inner wall surface of the groove 15, capacitor insulating film 20 and the cell plate electrode 22, and a second capacitor is formed by the electrically conductive member 43 provided at the perimeter of the groove 15, capacitor insulating film 20 and the cell plate electrode 22. The first capacitor and the second capacitor have the capacitor insulating film 20 and the cell plate electrode 22 in common and hence are parallel-connected to each other.

As compared with the conventional semiconductor memory device including the groove type capacitor, the present semiconductor memory device has the storage capacity increased in an amount corresponding to the capacitance of the second capacitor. Conversely, if it is desired to produce a semiconductor memory device having a storage capacity equal to the storage capacity of the conventional comparable memory device, the groove 15 may be decrease in depth. The shallower depth of the groove 15 is correlated directly with increase in mass producibility. On the other hand, the second capacitor is provided on the perimeter of the groove 15, so that the degree of integration is not lowered in any way.

The method for producing the semiconductor memory device shown in FIG. 2 is hereinafter explained.

Figure 3A:
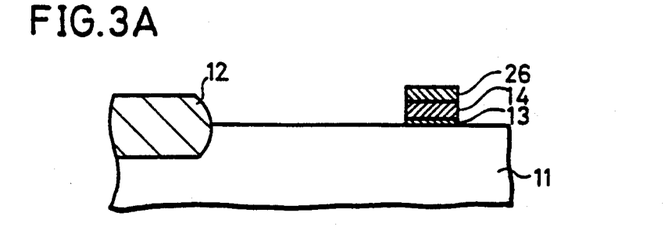
FIGS. 3A to 3K are cross-sectional views showing a production process for a semiconductor memory device according to an embodiment of the present invention.

Referring to FIG. 3A, the insulating film for element-to-element isolation or separation 12 is formed on the main surface of the semiconductor substrate 11 for separating an active region thereon from another. The gate oxide film 13, gate electrode 14 and the oxide film 26 of the field effect transistor are then formed on the semiconductor substrate 11 by sequentially forming a thermal oxidation film, polycrystal silicon film and a $SiO_2$ film on the semiconductor substrate 11 and dry-etching these films by the photolithographic method. The $SiO_2$ film is formed by chemical vapor deposition or CVD.

Figure 3B:
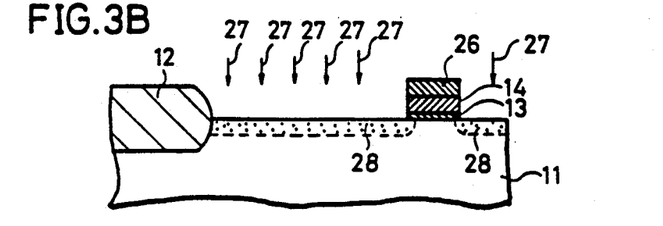

Then, referring to FIG. 3B, N-type impurity ions 27 are introduced in a self-aligning fashion towards the main surface of the semiconductor substrate 11. A first impurity-diffusion region 28 is formed by heat treatment on either sided of the gate electrode 14 on the main surface of the semiconductor substrate 11.

Figure 3C:
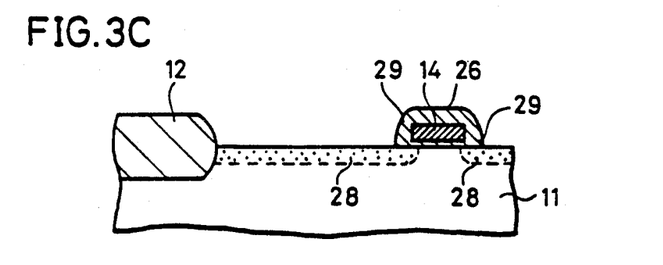
Figure 3D:
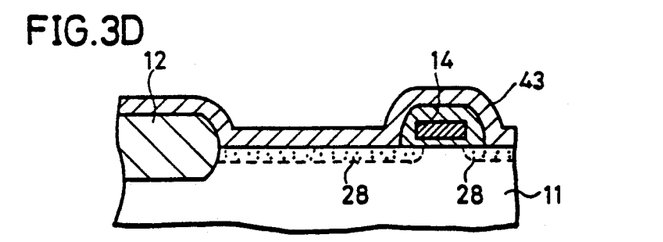

Then, referring to FIG. 3C, a sidewall spacer 29 is formed on the sidewall of the gate electrode 14. Then, referring to FIG. 3D, polycrystal silicon is deposited on the main surface of the semiconductor substrate 11 for forming the electrically conductive member 43.

Figure 3E:
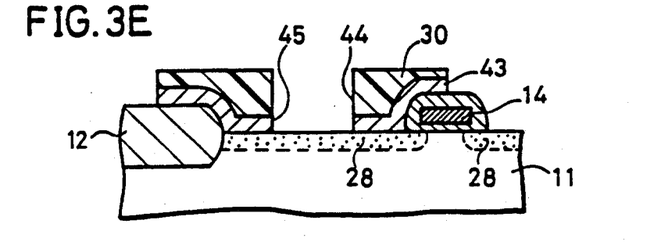

Then, referring to FIG. 3E, a photoresist for etching 30 is formed on the overall surface. The photoresist 30 is then patterned to a desired shape for forming an opening 44 at least above the region where the groove-type capacitor is to be formed. Then, using the patterned photoresist 30 as the mask, the electrically conductive member 43 is subjected to selective etching for forming an opening 45 in the electrically conductive member 43. This selective etching performed by reactive ion etching under conditions selected to provide for desired etching selectivity. The outer edge of the electrically conductive member 43 is also patterned to the desired shape. The photoresist 30 is then removed.

Figure 3F:
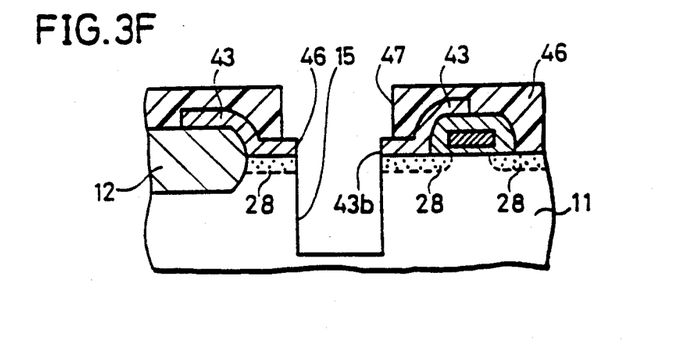

Then, referring to FIG. 3F, a photoresist for etching 46 is formed on the overall surface of the semiconductor substrate 11. The photoresist 46 is then patterned for forming an opening 47 of a desired shape above the region where the groove-type capacitor is to be formed. The photoresist 46 is patterned with the use of a mask, but accurate mask matching is not required at this time. Thus the end surface of the opening 47 need not be aligned with the surface of the opening 45. In as much as mask matching may be made with broader tolerance, the production efficiency may be improved significantly.

The semiconductor substrate 11 is then etched in a self-aligning manner to form the groove 15 on the main surface of the semiconductor substrate 11 under highly selective etching conditions for selectively etching the semiconductor substrate 11 rather than the electrically conductive member 43. Since the etching is performed at this time in a self aligning manner, the end surface 43b of the opening of the electrically conductive member 43 and the inner wall surface of the groove 15 are formed on the same level. The photoresist 46 is then removed.

Figure 3G:
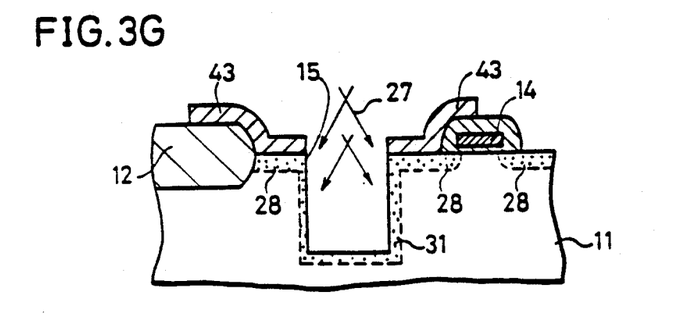

Then, referring to FIG. 3G, N-type impurity ions 27 are introduced by rotary ion implantation into the sidewall and bottom surface of the groove 15. After ion implantation, a second impurity-diffusion region 31 is formed in contribution to the first impurity-diffusion region 28 by heat treatment on the sidewall treatment on the sidewall and bottom surface of the groove 15.

Figure 3H:
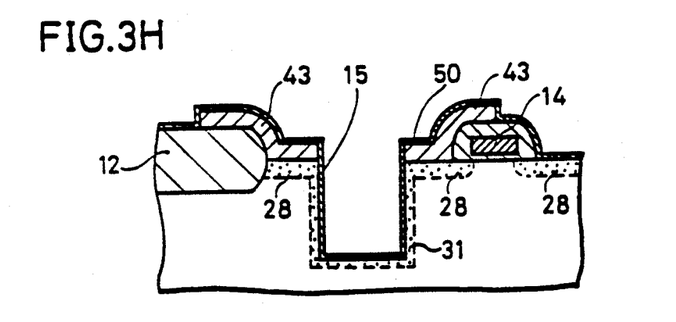

Then, referring to FIG. 3H, a nitride film 50 is formed on the main surface of the semiconductor substrate 11 for covering the exposed surface of the electrically conductive member 43 and the inner surface of the groove 15. This nitride film 50 then is subjected to thermal oxidation.

Figure 3I:
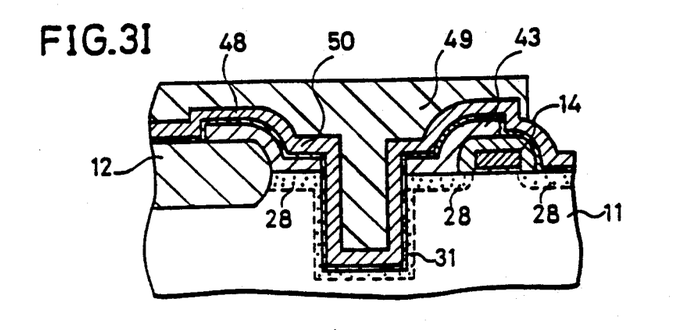

Then, referring to FIG. 3I, a polycrystal silicon film 48 is formed on the overall surface of the semiconductor substrate 11 for covering the nitride film 50. A photoresist for etching 49 is then formed on the overall surface of the semiconductor substrate 11. The photoresist for etching 49 is then patterned to a desired shape.

Figure 3J:
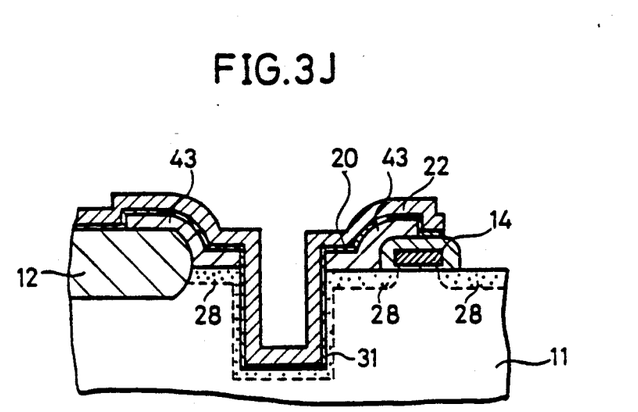

Referring to FIGS. 3I and 3J, the polycrystal silicon film 48 and the nitride film 50 ar patterned to produce the capacitor insulating film 20 and the cell plate electrode 22 of the desired form.

Figure 3K:
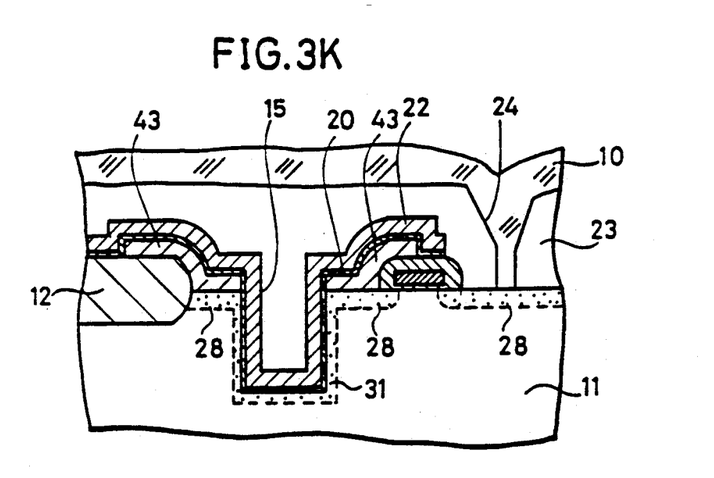

Then, referring to FIG. 3K, the interlayer film 23 is heaped by CVD on the overall surface of the semiconductor substrate 11. At this time, part of the interlayer insulating film 23 is buried in the inside of the groove 15. The contact hole 24 is then formed in the interlayer insulating film 23 and the bit line 10 is connected via this contact hole 24 with the first impurity diffusion region 28 to complete the semiconductor memory device shown in FIG. 2.

In the above embodiment, the capacitor insulating film 20 is formed by a thermally oxidized nitride film. However, with the use of a high dielectric constant film, such as $Ta_2O_5$ film, or a multilayer insulating film comprised of a nitride film and a $Ta_2O_5$ film, a semiconductor memory device having a larger capacity may be produced.

Although the cell plate electrode 22 is formed for extending along the inner wall surface of the groove 15, polycrystal silicon may also be buried completely within the groove 15.

Figure 4:
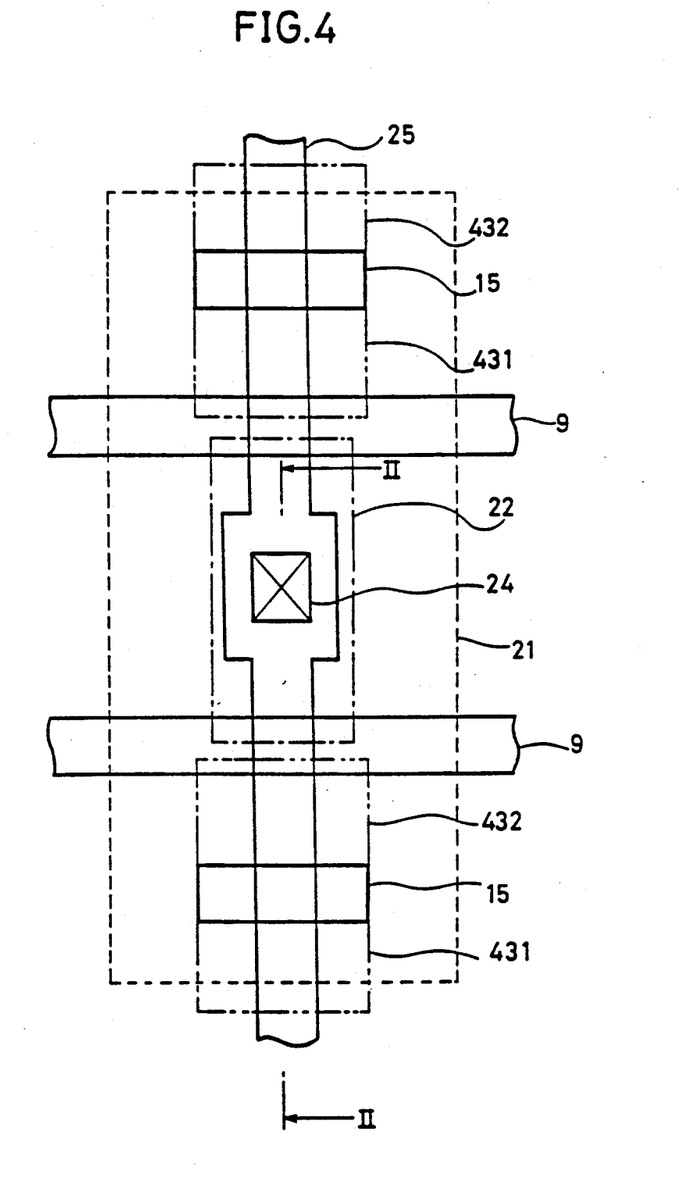
FIG. 4 is a plan view of a semiconductor memory device according to another embodiment of the present invention.

FIG. 4 is a plan view showing a modification of the present invention. The cross-section taken along line II—II of FIG. 4 is completely identified with the sectional view of FIG. 2.

The embodiment shown in FIG. 4 is the same as the embodiment shown in FIGS. 1 and 2. Thus the corresponding parts are designated by same reference numerals and the corresponding description is not made for simplicity.

The electrically conductive 43 is formed in the embodiment shown in FIG. 1 for surrounding the groove 15, whereas, in the present embodiment separate electrically conductive members 431 and 432 are formed on either sides of the groove 15. Referring to FIGS. 2 and 4, in the present embodiment of the semiconductor device, a first groove type capacitor is formed by the storage node 16 formed on the inner wall surface of the groove 15, capacitor insulating film 20 and the cell plate electrode 22, a second capacitor is formed by the electrically conductive member 431 on one side of the groove 15, capacitor insulating film 20 and the cell plate electrode 22, and a third capacitor is formed by the electrically conductive member 432 on the other side of the groove 15, capacitor insulating film 20 and the cell plate electrode 22. With the first, second and the third capacitors having the capacitor insulating film 20 and the cell plate 22 in common, these three capacitors are parallel connected to one another. With this arrangement the effects similar to those of the first embodiment may be produced.

The above described semiconductor memory device of the present invention includes a first groove type capacitor comprises of a first electrically conductive region formed on the inner wall of the groove, capacitor insulating film and a cell plate electrode, and a second capacitor comprised of an electrically conductive member provided at the perimeter of the groove, the capacitor insulating film and the cell plate electrode. Hence, as compared with the conventional semiconductor memory device provided only with the groove type capacitor, the present semiconductor memory device has a storage capacity which is increased by an amount corresponding to the storage capacity of the second capacitor. Therefore, if the storage capacity which is the same as that of the conventional semiconductor memory device is desired the groove may be of a lesser depth, with the result that the mass producibility of the memory device may be increased. Since the second capacitor is formed around the groove, the degree of integration is not lowered in any way. In the method for producing the semiconductor memory device according to another aspect of the present invention, high accuracy mask matching is not required in producing the groove on the main surface of the semiconductor substrate, with the result that the production efficiency of the memory device may be improved significantly.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for producing a semiconductor memory device for storing the information as a function of the presence or absence of electrical charges stored in a groove capacitor, comprising the steps of:
    forming a gate electrode (14) for a transistor on a main surface of a semiconductor substrate (11),
    forming a first impurity-diffusion layer (28) on both sides of said gate electrode (14) on the main surface of said semiconductor substrate (11),
    after formation of said first impurity-diffusion layer (28), forming an electrically conductive member (43) on the main surface of said semiconductor substrate (11),
    patterning said electrically conductive member (43) for forming an opening of a predetermined shape thereby defining a region for forming said groove capacitor,
    forming a groove (15) of said groove capacitor by selectively etching a portion of the main surface of said semiconductor substrate (11) exposed by the formation of said opening,
    forming a second impurity-diffusion layer (31) on at least a sidewall of said groove (15),
    forming a capacitor insulating film (20) on the main surface of said semiconductor substrate (11) for covering an exposed surface of said electrically conductive member (43) and an inner surface of said groove (15), and
    forming a cell plate electrode (22) on said capacitor insulating film (20).

2. The method according to claim 1, wherein said groove (15) of said groove type capacitor is formed under highly selective etching conditions wherein said semiconductor substrate (11) is selectively etched while said electrically conductive member (43) is left substantially unetched.

3. The method according to claim 1, wherein said step of forming said groove (15) comprises using said opening in said electrically conductive member (43) as a mask for etching said portion of the main surface of said semiconductor substrate.

4. The method according to claim 1, wherein said step of forming a cell plate electrode (22) comprises forming a polycrystal silicon film (49) on said capacitor insulating film (20) and patterning said polycrystal silicon film (49) to form said cell plate electrode (22).

5. The method according to claim 1, wherein said step of forming said groove (15) comprises the steps of depositing a photoresist on said electrically conductive member (43), and performing a self aligning etching, thereby to form an end surface of said opening of said electrically conductive member (43) and the inner wall surface of said groove (15) in a common plane.

6. The method according to claim 5, wherein said step of forming said groove (15) further comprises using said opening in said electrically conductive member (43) as a mask for etching said portion of the main surface of said semiconductor substrate.

7. The method according to claim 1, wherein said step of forming a capacitor insulating film (20) comprises forming a nitride film (50) at least on the inner surface of said groove (15), and
    thermally oxidizing said nitride film to form said insulating film (20).

8. The method according to claim 7, wherein said step of forming a cell plate electrode (22) comprises:
    forming a polycrystal silicon film (49) on said oxidized nitride film, and
    patterning said polycrystal silicon film and said oxidized nitride film to form said insulating film (20) and said cell plate electrode (22).

9. The method according to claim 1, wherein said step of forming a capacitor insulating film (20) comprises forming a film at least on the inner surface of said groove (15), wherein the film is a material selected from the group consisting of $Ta_2O_5$ film and a multilayer film including a nitride film and a $Ta_2O_5$ film.

10. The method according to claim 9, wherein said step of forming a cell plate electrode (22) comprises forming a polycrystal silicon film (49) on said capacitor insulating film (20) and patterning said polycrystal silicon film (49) to form said cell plate electrode (22).

* * * * *